United States Patent [19]

Schweitzer, Jr.

[11] 3,974,446

[45] Aug. 10, 1976

[54] POLYPHASE FAULT CURRENT FLOW DETECTING AND RESETTING MEANS

[76] Inventor: Edmund O. Schweitzer, Jr., 1002 Dundee Road, Northbrook, Ill. 60062

[22] Filed: Apr. 10, 1975

[21] Appl. No.: 566,994

[52] U.S. Cl. ............................. 324/133; 317/23; 324/51; 340/253 A
[51] Int. Cl.² ................. G01R 19/16; G01R 31/02
[58] Field of Search ............ 324/51, 127, 133, 102; 340/253 A; 317/22, 23, 33 SC

[56] References Cited
UNITED STATES PATENTS

| | | | |
|---|---|---|---|
| 3,524,133 | 8/1970 | Arndt | 324/133 X |
| 3,715,742 | 2/1973 | Schweitzer | 324/133 UX |
| 3,771,049 | 11/1973 | Piccione | 324/127 X |
| 3,816,816 | 6/1974 | Schweitzer | 340/253 A X |
| 3,866,197 | 2/1975 | Schweitzer | 324/133 X |
| 3,870,928 | 3/1975 | Allen | 317/22 X |
| 3,875,464 | 4/1975 | Gary et al. | 317/33 SC X |

Primary Examiner—Gerard R. Strecker
Attorney, Agent, or Firm—Lockwood, Dewey, Zickert & Alex

[57] ABSTRACT

Detection of fault current flow in any conductor of a polyphase alternating current system is provided by a fault responsive device that is reset only when normal current flows in each conductor. A reed relay is latched in operated condition on the occurrence of a fault and is unlatched by application of a direct current source.

7 Claims, 2 Drawing Figures

POLYPHASE FAULT CURRENT FLOW DETECTING AND RESETTING MEANS

This invention relates, generally to fault indicating and resetting means for use with high voltage polyphase electric power distribution systems. It constitutes an improvement over the arrangements disclosed in my U.S. Pat. Nos. 3,715,742, issued Feb. 6, 1973, and 3,866,197, issued Feb. 11, 1975 and the prior art references specified therein.

Among the objects of this invention are: To detect the flow of fault current in any conductor of a polyphase high voltage electric power distribution system and to reset the fault detecting means only when normal current flows in each of the conductors; to provide separate means for response to flow in each conductor of fault current and normal load current; to reset the fault detecting means only in response to the generation of a voltage as a result of normal current flow in all of the conductors; to generate a direct voltage constant in value individual to each conductor or current flow therein over a relatively wide range; and to operate reed switch means independently of and simultaneously with operation of the fault detecting means in response to flow of fault current in any of the conductors.

Figure 1:
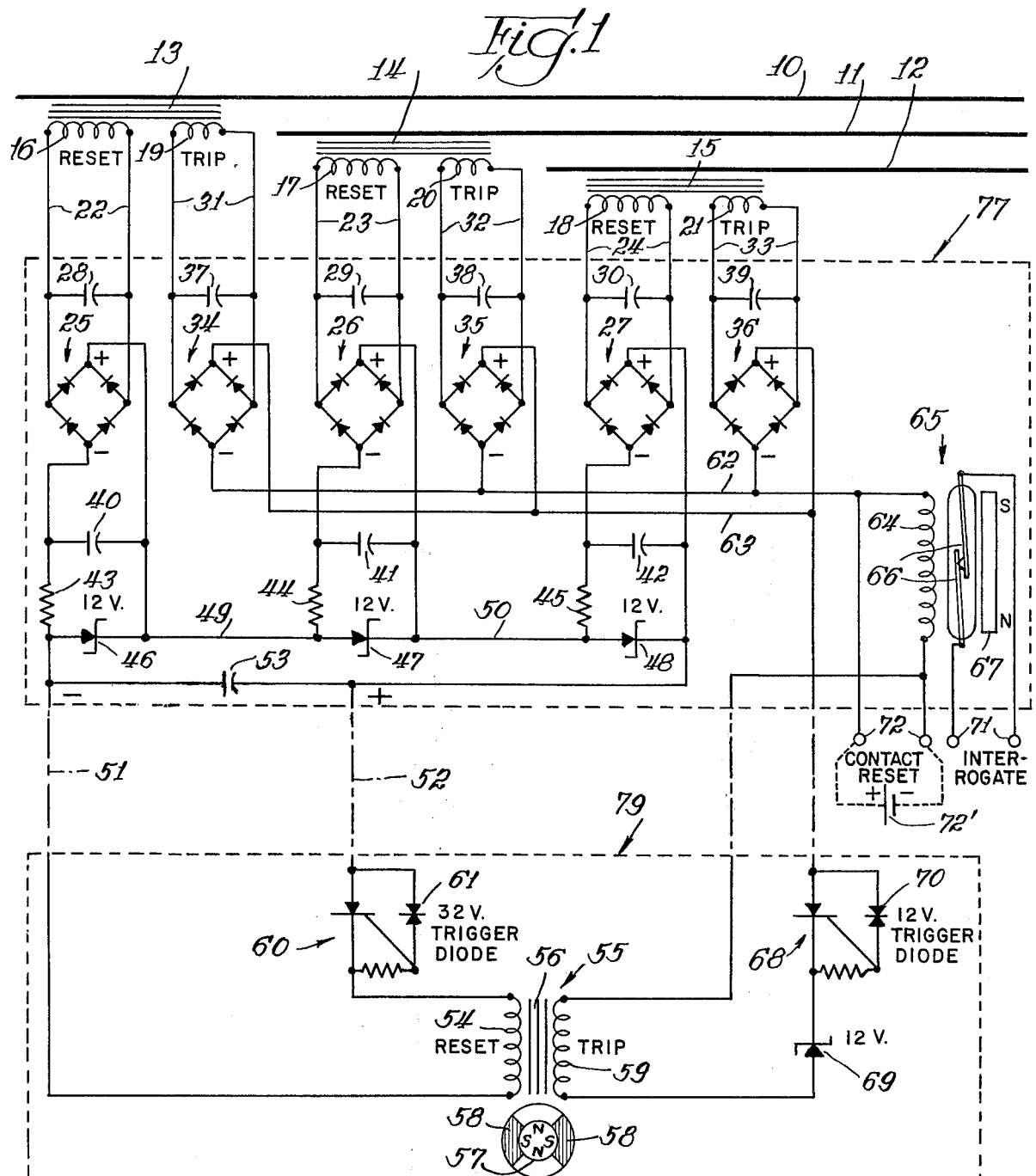
FIG. 1 illustrates, diagrammatically, an embodiment of this invention.

In FIG. 1 reference characters 10, 11 and 12 designate the conductors of a high voltage alternating current power systems operating at voltages ranging upwardly from 2,300 volts. Magnetic cores 13, 14 and 15 are associated, respectively, with the conductors 10, 11 and 12. These cores have reset secondary windings 16, 17 and 18 wound respectively thereon together with trip secondary windings 19, 20 and 21. The reset secondary windings each may have 7,000 turns while the trip secondary windings each may have 1,000 turns. Conductors 22, 23 and 24 respectively interconnect the reset secondary windings 16, 17 and 18 and reset rectifier means 25, 26 and 27. Wave shape capacitors 28, 29 and 30 are connected respectively between the conductors 22, 23 and 24. Conductors 31, 32 and 33 respectively interconnect the trip secondary windings 19, 20 and 21 and trip rectifier means 34, 35 and 36. Wave shape capacitors 37, 38 and 39 are connected respectively between the conductors 31, 32 and 33.

The direct current ouputs of the rectifier means 25, 26 and 27 are connected respectively across capacitors 40, 41 and 42 and through resistors 43, 44 and 45 across Zener diodes 46, 47 and 48. The relation between the resistors 43, 44 and 45 and the respective diodes 46, 47 and 48 is such that, on current flow in the respective conductors 10, 11 and 12, such as normal current flow and above, a fixed voltage, for example 12 direct volts, appears across each of the Zener diodes 46, 47 and 48. Conductors 49 and 50 connect the Zener diodes 46, 47 and 48 in series so that the total direct voltage of 36 volts, for example, is applied between conductors 51 and 52 between which a capacitor 53 is connected.

The direct voltage appearing between conductors 51 and 52 is employed for energizing a reset winding 54 of a fault responsive device, indicated at 55, which is generally of the construction disclosed in my U.S. Pat. No. 3,715,742. It includes a magnetic circuit 56 to which the reset winding 54 is applied and a cooperating pivoted permanent magnet 57 which carries targets 58. A fault responsive or trip winding 59 is also applied to the magnetic circuit 56 for energization in a manner to be described.

The reset winding 54 is energized only when the sum of the direct voltages across the Zener diodes 46, 47 and 48 is applied between conductors 51 and 52. For this purpose there is connected in series with the reset winding 54 an SCR or a voltage sensitive switch 60 the conductivity of which is controlled by a trigger diode 61 that is adapted to become conducting only when a voltage, for example 32 direct volts, is applied thereto that is greater than the voltages appearing across two of the Zener diodes 46, 47 and 48. Thus, on flow of normal load current, for example 200 amperes, in each of the conductors 10, 11 and 12, sufficient direct voltage, 36 direct volts for example, is applied to the trigger diode 61 to render it conducting. This, in turn renders the SCR 60 conducting and reset winding 54 is energized to shift the targets 58 to a non-indicating or normal position. However, if normal current flows in only one or two of the conductors 10, 11 and 12, sufficent direct voltage is not available to render the trigger diode 61 conducting, consequently, the SCR 60 remains non-conducting and the reset winding 54 unenergized.

The direct current outputs of the rectifier means 34, 35 and 36 are connected in parallel by conductors 62 and 63 and through a winding 64 of a latching reed relay, shown generally at 65, which has contacts 66 that normally are held closed by a biasing magnet 67. The parallel circuit continues to the trip winding 59 through an SCR or voltage sensitive switch 68 and a Zener diode 69. The SCR 68 is rendered conducting when an associated trigger diode 70 breaks down on flow of fault current, such as 1000 or more amperes, in any of the conductors 10, 11 and 12. When this occurs, winding 64 is energized in series with trip winding 59 to open contacts 66 and to shift the targets 58 to the alternate or tripped position.

The condition of contacts 66 can be determined by interrogating them using the interrogating device disclosed in my application Ser. No. 441,298, filed Feb. 11, 1974, now Pat. No. 3,876,911, issued Apr. 8, 1975, and connecting it to external contact 71. The same device can be employed for applying a resetting direct voltage to external contacts 72 by battery 72' for energizing the winding 64 with opposite polarity to open contacts 66. This does not effect energization of trip winding 59 since the circuit to it is open at the voltage sensitive switch 68.

From the foregoing it will be apparent that the trip winding 59 of the fault responsive device 55 is energized and contacts 66 are opened when fault current flows in any one of the conductors 10, 11 and 12. The reset winding 54 will be energized only when normal current flows through all of conductors 10, 11 and 12.

Figure 2:
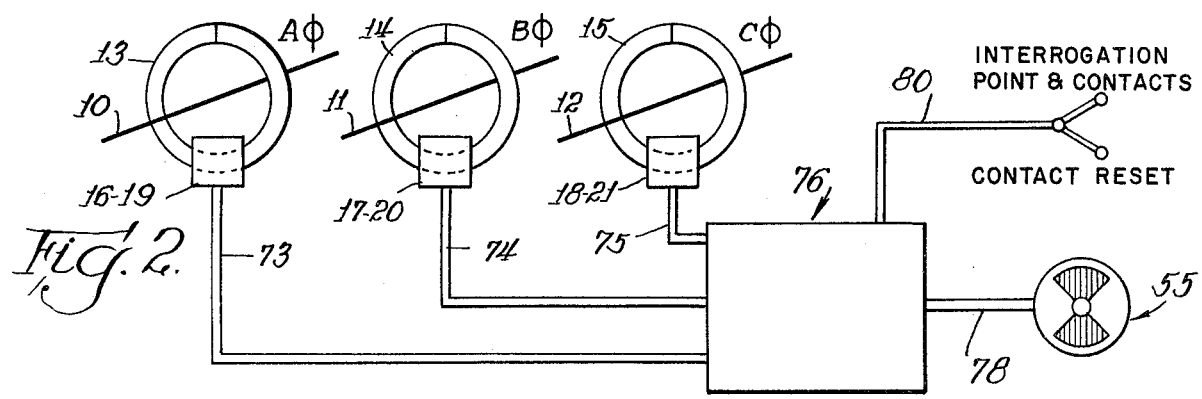
FIG. 2 is a schematic diagram of the invention.

FIG. 2 shows schematically, the circuits illustrated in FIG. 1. Here four conductor cables 73, 74 and 75 interconnect the pairs of secondary windings and the circuitry indicated at 76 comprising the apparatus within the broken line outline 77 in FIG. 1. This apparatus and associated conductors can be potted and located conveniently at ground potential. A four conductor cable 78 interconnects the circuitry 76 and the fault responsive device 55 together with its associated circuitry enclosed by broken line outline 79 in FIG. 1. A four conductor cable 80 connects the contacts 71 and 72 to a location, such as an office remote from the circuitry 77 as may be desired.

I claim:

1. Means for detecting flow of fault current in any phase conductor of a polyphase alternating current transmission system in which normal current flow is substantially less than said fault current flow comprising: a fault responsive device including a magnetic circuit, a trip winding on said magnetic circuit, trip current transformer means and trip rectifier means interconnecting each phase conductor and said trip winding for energizing it with direct current according to the magnitude of the flow of fault current in any of said phase conductors, a reset winding on said magnetic circuit, and reset current transformer and reset rectifier means interconnecting each phase conductor and said reset winding for energizing it with direct current according to the magnitude of the simultaneous flow of normal current in each of said phase conductors.

2. Fault current flow detecting means according to claim 1 wherein circuit means interconnect said trip rectifier means in parallel circuit relation with said trip winding.

3. Fault current flow detecting means according to claim 2 wherein a reed switch operating winding is connected in series circuit relation with said trip winding, and normally open reed contacts are arranged to be closed on energization of said operating winding.

4. Fault current flow detecting means according to claim 3 wherein contacts are connected to said reed switch operating winding for connection to a direct current source for demagnetizing said operating winding.

5. Fault current flow detecting means according to claim 1 wherein circuit means interconnect said reset rectifier means in series circuit relation and across said reset winding.

6. Fault current flow detecting means according to claim 5 wherein a Zener diode is connected in shunt circuit relation to each reset rectifier means through a resistor.

7. Fault current flow detecting means according to claim 5 wherein said circuit means includes voltage sensitive switch means, and trigger means arranged to render said voltage sensitive switch means conducting only when the voltages generated by all of said rectifier means are applied to said trigger means.

* * * * *